United States Patent
Barrett et al.

(10) Patent No.: US 8,003,428 B2
(45) Date of Patent: Aug. 23, 2011

(54) METHOD OF FORMING AN INVERTED LENS IN A SEMICONDUCTOR STRUCTURE

(75) Inventors: Terence Barrett, Burlington, VT (US); Jeffrey P. Gambino, Westford, VT (US); Robert K. Leidy, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 542 days.

(21) Appl. No.: 12/056,736

(22) Filed: Mar. 27, 2008

(65) Prior Publication Data

US 2009/0242948 A1  Oct. 1, 2009

(51) Int. Cl.
*H01L 21/00* (2006.01)
(52) U.S. Cl. ........ 438/70; 438/57; 438/69; 257/E21.001
(58) Field of Classification Search ............ 438/69, 438/70; 257/294, 432, E21.001
See application file for complete search history.

(56) References Cited

U.S. PATENT DOCUMENTS

| | | | |
|---|---|---|---|
| 5,593,913 A * | 1/1997 | Aoki ............................. | 438/69 |
| 6,344,369 B1 * | 2/2002 | Huang et al. ................... | 438/70 |
| 6,750,912 B1 | 6/2004 | Tennant et al. | |
| 7,029,944 B1 * | 4/2006 | Conley et al. .................. | 438/69 |
| 2005/0045927 A1 | 3/2005 | Li | |
| 2005/0200960 A1 * | 9/2005 | Tang ............................ | 359/619 |
| 2005/0274968 A1 | 12/2005 | Kuo et al. | |
| 2006/0148159 A1 * | 7/2006 | Seo et al. ...................... | 438/199 |
| 2006/0151818 A1 * | 7/2006 | Toumiya ....................... | 257/294 |
| 2007/0037381 A1 * | 2/2007 | Shim ............................ | 438/622 |
| 2008/0042177 A1 * | 2/2008 | Park ............................. | 257/294 |
| 2009/0008687 A1 * | 1/2009 | Katsuno et al. ................ | 257/292 |
| 2010/0059838 A1 * | 3/2010 | Yang et al. .................... | 257/432 |

* cited by examiner

*Primary Examiner* — Angel Roman
(74) *Attorney, Agent, or Firm* — Scully, Scott, Murphy & Presser, P.C.; Anthony J. Canale (57) ABSTRACT

A flat-top convex-bottom lower lens is formed by first applying a positive tone photoresist over a silicon oxide layer and an optional metallic barrier layer thereupon in a back-end-of-line (BEOL) metallization structure. The positive tone photoresist is exposed under defocused illumination conditions and/or employing a half-tone mask so that a cross-sectional profile of the positive tone photoresist after exposure contains a continuous and smooth concave profile, which is transferred into the underlying silicon oxide layer to form a concave cavity therein. After removing the photoresist, the cavity is filled with a high refractive index material such as silicon nitride, and planarized to form a flat-top convex-bottom lower lens. Various aluminum metal structures, a color filter, and a convex-top flat-bottom upper lens are thereafter formed so that the upper lens and the lower lens constitute a composite lens system.

15 Claims, 5 Drawing Sheets

METHOD OF FORMING AN INVERTED LENS IN A SEMICONDUCTOR STRUCTURE

FIELD OF THE INVENTION

The present invention relates to a method of forming a semiconductor structure, and particularly to a method of forming an inverted lens that may be advantageously employed in a complementary metal oxide semiconductor (CMOS) image sensor structure formed on a semiconductor substrate, and structures formed by the same.

BACKGROUND OF THE INVENTION

An image sensor converts a visual image to digital data that may be represented by a picture. The image sensor comprises an array of pixels, which are unit devices for the conversion of the visual image into digital data. Digital cameras and optical imaging devices employ an image sensor. Image sensors include charge-coupled devices (CCDs) or complementary metal oxide semiconductor (CMOS) image sensors.

While CMOS image sensors have been more recently developed compared to the CCDs, CMOS image sensors provide an advantage of lower power consumption, smaller size, and faster data processing than CCDs as well as direct digital output that is not available in CCDs. Also, CMOS image sensors have lower manufacturing cost compared with the CCDs since many standard semiconductor manufacturing processes may be employed to manufacture CMOS image sensors. For these reasons, commercial employment of CMOS image sensors has been steadily increasing in recent years.

The CMOS image sensor unit cell comprises a pixel area and a logic area. The pixel area typically contains one of each type of active pixel, e.g., a red pixel having a first photodiode underneath a red optical filter, a green pixel having a second photodiode underneath a green optical filter, and a blue pixel having a third photodiode underneath a blue optical filter. The pixel area may also contain a dark pixel, which is covered with an opaque layer such as an aluminum light shield and employed to measure a background output level in the absence of illumination so that the output of other pixels may be referenced and calibrated. U.S. Pat. No. 6,750,912 to Tennant et al. describes use of a dark pixel and is incorporated herein by reference.

Each photodiode generates charges upon exposure to light. Logic devices connected to the photodiode detect and amplify the charges to generate signals proportional to the incident light. Each pixel comprises at least one photodiode to covert incident photons into electrical charges. Since the area of the photodiode is less than the area of each pixel, a convex-top flat-bottom lens, i.e., an optical lens having a convex surface at the top and a substantially flat surface at the bottom, is typically formed over each photodiode so that photons incident upon a convex-top flat-bottom lens are focused onto the photodiode located underneath. Typically, a color filter is formed between the convex-top flat-bottom lens and the photodiodes to make each pixel color-sensitive, i.e., responsive to photons within a certain wavelength range. The convex-top flat-bottom lens thus acts to focus light over a wide area onto the area of the photodiodes.

The efficiency of each photodiode depends on the quality of the lens system thereabove, that is, the better the lens system collects photons onto the area of the photodiode, the higher the efficiency of the pixel containing the photodiode. Thus, lens systems employing more than one lens has been known in the art. For example, U.S. Patent Application Publication No. 2005/0274968 to Kuo et al. discloses composite lens systems comprising an upper lens and a lower lens. While such a composite lens system can improve the overall sensitivity, or efficiency, of an image sensor pixel, the lower lens structures in Kuo et al. do not provide an ideal lens structure due to the inherent nature of the processing steps employed in the manufacture. Although a flat-top convex-bottom lens with smooth outer surfaces is desired for an ideal lower lens, the lower lens structures provided by Kuo et al. contains at least one step at which the thickness of the lower lens has a discontinuity.

While a flat-top convex-bottom lens is disclosed, for example, in U.S. Patent Application Publication No. 2005/0045927 to Li, integration of such a flat-top convex-bottom lens into a composite lens system containing another lens is challenging since the materials and processes employed in the manufacture of the flat-top convex-bottom lens in Li is not amenable to integration of additional lenses. Of particular concern is the need to provide a material with a higher refractive index that may be patterned into the shape of a lens in a manner compatible with standard CMOS processing steps.

In view of the above, there is a need for an improved composite lens system that enhances the efficiency of an image sensor pixel by providing a higher degree of focusing for incident light, and methods of manufacturing the same.

SUMMARY OF THE INVENTION

To address the needs described above, the present invention provides a composite lens system containing a convex-top flat-bottom upper lens and a flat-top convex-bottom lower lens comprising a high refractive index material and having smooth surfaces, and methods of manufacturing the same.

In the present invention, a flat-top convex-bottom lower lens is formed by first applying a positive tone photoresist over a silicon oxide layer and an optional metallic barrier layer thereupon in a back-end-of-line (BEOL) metallization structure. The positive tone photoresist is exposed under defocused illumination conditions and/or employing a half-tone mask so that a cross-sectional profile of the positive tone photoresist after exposure contains a continuous and smooth concave profile, which is transferred into the underlying silicon oxide layer to form a concave cavity therein. After removing the photoresist, the cavity is filled with a high refractive index material such as silicon nitride, and planarized to form a flat-top convex-bottom lower lens. Various aluminum metal structures, a color filter, and a convex-top flat-bottom upper lens are thereafter formed so that the upper lens and the lower lens constitute a composite lens system.

According to one embodiment of the present invention, a method of forming a semiconductor structure is provided, which comprises:

forming a silicon oxide layer on top of a metal interconnect structure;

applying a positive tone photoresist on the silicon oxide layer;

exposing the positive tone photoresist under a defocused illumination condition;

developing the positive tone photoresist, wherein the positive tone resist has a continuous and concave profile in an exposed area after development;

transferring the profile into the silicon oxide layer to form a concave cavity in the silicon oxide layer; and forming a flat-top convex-bottom lens comprising a dielectric material in the concave cavity.

According to another embodiment of the present invention, another method of forming a semiconductor structure is provided, which comprises:

forming a silicon oxide layer on top of a metal interconnect structure;

applying a positive tone photoresist on the silicon oxide layer;

exposing the positive tone photoresist employing a half-tone mask, wherein the half-tone resist induces gradual variation of dose of exposure light across the positive tone photoresist;

developing the positive tone photoresist, wherein the positive tone resist has a continuous and concave profile in an exposed area after development;

transferring the profile into the silicon oxide layer to form a concave cavity in the silicon oxide layer; and forming a flat-top convex-bottom lens comprising a dielectric material in the concave cavity.

According to yet another embodiment of the present invention, yet another method of forming a semiconductor structure is provided, which comprises:

forming a silicon oxide layer on top of a metal interconnect structure;

applying a positive tone photoresist on the silicon oxide layer;

exposing the positive tone photoresist employing a half-tone mask and under a defocused illumination condition, wherein the half-tone resist induces gradual variation of dose of exposure light across the positive tone photoresist;

developing the positive tone photoresist, wherein the positive tone resist has a continuous and concave profile in an exposed area after development;

transferring the profile into the silicon oxide layer to form a concave cavity in the silicon oxide layer; and forming a flat-top convex-bottom lens comprising a dielectric material in the concave cavity.

In all embodiments of the present invention, the method may further comprise forming a metallic barrier layer directly on the silicon oxide layer, wherein the positive tone resist is applied directly on the metallic barrier layer. For example, the metallic barrier layer may comprise TiN, TaN, WN, AlN, or a combination thereof.

A thickness of the positive tone photoresist may vary continuously throughout an entirety of the positive tone photoresist after the developing.

The dielectric material may comprise silicon nitride.

Each of the methods may further comprise planarizing the dielectric material to form a flat surface, wherein the flat surface is a top surface of the flat-top convex-bottom lens.

Each of the methods may further comprise forming a metallic barrier layer directly on the silicon oxide layer, wherein the metallic barrier layer is a stopping layer during the planarizing of the dielectric material.

Each of the methods may further comprise:

forming an aluminum layer on the silicon oxide layer and the flat-top convex-bottom lens; and patterning the aluminum layer to form an aluminum metal line, a light shield, or an aluminum bond pad.

Each of the methods may further comprise:

forming a color filter above the flat-top convex-bottom lens; and forming a convex-top flat-bottom lens over the color filter.

Each of the methods may further comprise employing a non-selective reactive ion etch is employed for the transferring of the profile into the silicon oxide layer, wherein the non-selective reactive ion etch removes the silicon oxide layer and the positive tone resist at substantially the same rate.

The convex-top flat bottom lens and the flat-top convex-bottom lens form a composite lens system, which is advantageously employed to enhance light collection capacity and efficiency of a CMOS image sensor unit. The CMOS image sensor unit may include a plurality of image sensor pixels corresponding to different colors, wherein each image sensor pixel contains a composite lens system of a convex-top flat bottom lens and a flat-top convex-bottom lens.

According to still another embodiment of the present invention, a semiconductor structure is provided, which comprises:

a photodiode located in a semiconductor substrate;

at least one dielectric layer containing a metal interconnect structure located on the photodiode;

a silicon oxide layer located directly on the at least one dielectric layer, wherein the silicon oxide layer contains a concave cavity;

a flat-top convex-bottom lens located in the concave cavity and comprising a dielectric material different from silicon oxide;

at least one metallic barrier structure located directly on the silicon oxide layer and disjoined from the flat-top convex-bottom lens;

at least one aluminum structure located directly on the at least one metallic barrier structure and disjoined from the flat-top convex-bottom lens;

a color filter located above the flat-top convex-bottom lens; and a convex-top flat-bottom lens located above the color filter.

The flat-top convex-bottom lens may comprise silicon nitride.

A flat top surface of the flat-top convex-bottom lens may be substantially coplanar with a top surface of the at least one metallic barrier structure.

The at least one metallic barrier structure and the at least one aluminum structure may have substantially vertically coincident sidewalls.

The semiconductor may further comprise another silicon oxide layer abutting a top surface of the flat-top convex-bottom lens, the at least one metallic barrier structure, and the at least one aluminum structure.

DETAILED DESCRIPTION OF THE INVENTION

As stated above, the present invention relates to a method of forming an inverted lens that may be advantageously employed in a complementary metal oxide semiconductor (CMOS) image sensor structure formed on a semiconductor substrate, and structures formed by the same, which are now described in detail with accompanying figures. It is noted that like and corresponding elements are referred to by like names or reference numerals in the figures.

Figure 1:
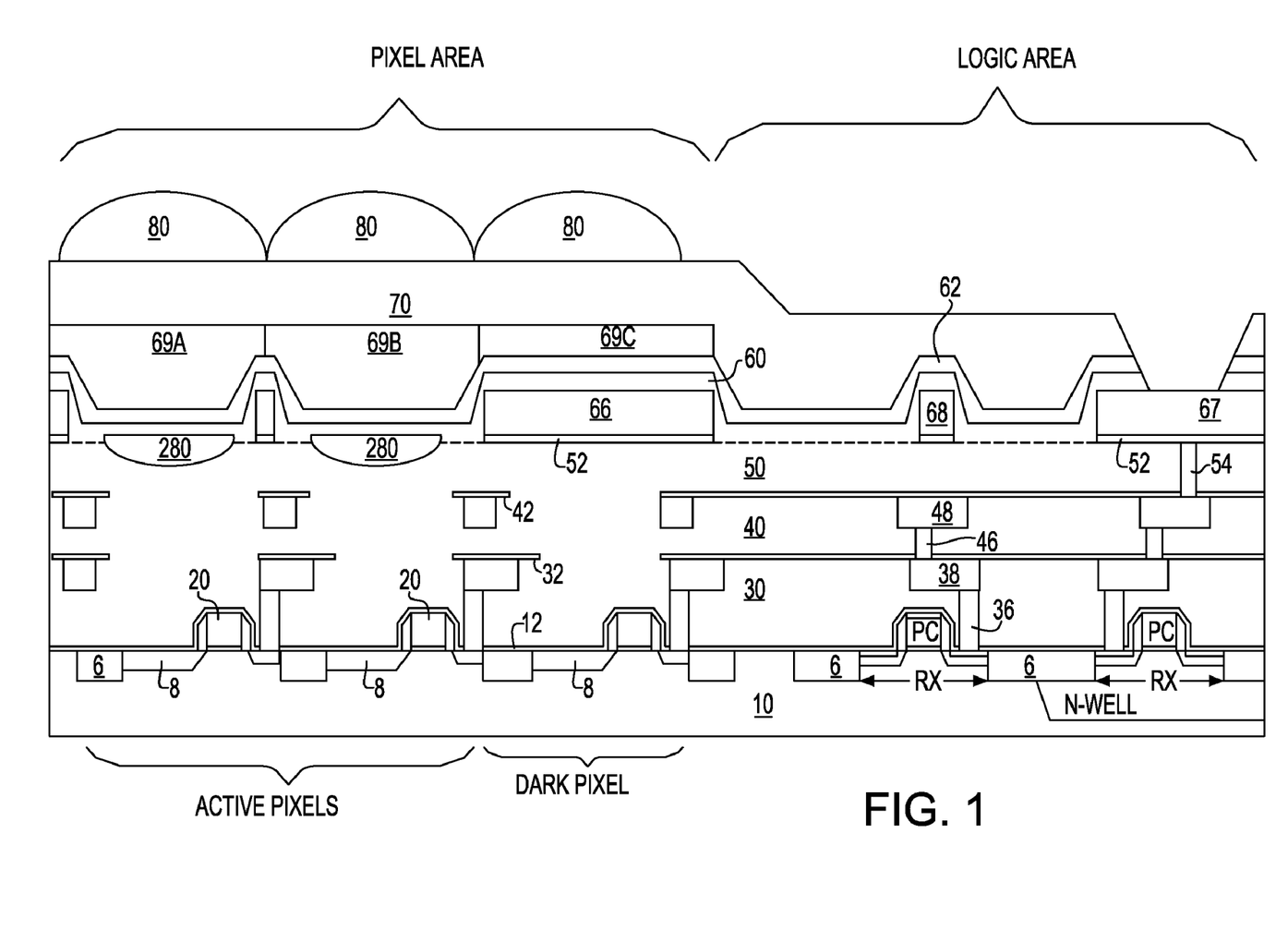
FIG. 1 is a vertical cross-sectional view of an exemplary semiconductor structure according to the present invention.

FIG. 1 shows a vertical cross-sectional view of an exemplary CMOS image sensor unit cell comprising a semiconductor substrate 10, gate electrode structures 20, a contact array and first metal line (CA-M1) level dielectric layer 30, a second metal line (M2) level dielectric layer 40, a second via (V2) level dielectric layer 50, a third metal line (M3) level dielectric layer 60, and a dielectric passivation layer 70. The exemplary CMOS image sensor unit further comprises pixel area which contain one pixel of each type and a logic area containing standard semiconductor devices.

Each pixel may be an active pixel containing a combination of a photodiode 8, a composite lens system comprising a convex-top flat-bottom upper lens 80 and a flat-top convex-bottom lower lens 280, and a color filter (69A or 69B) containing a color filter material, i.e., a material with altered refractive index to modulate the wavelength of light therein. Preferably, the pixel area also contains a dark pixel which comprises a photodiode 8, another convex-top flat-bottom upper lens 80, and an aluminum light shield 66 so that photons passing through the convex-top flat-bottom upper lens 80 above the aluminum light shield 66 is absorbed in the aluminum light shield 66. The dark pixel provides a reference point for background current, or "dark current" that is generated within a photodiode 8 in the absence of any illumination, so that a logic circuitry amplifying the charge in a floating drain region may subtract the background level signal corresponding to no illumination from the signal from each active pixel.

In addition to the photodiodes 8, the semiconductor substrate 10 also comprises shallow trench isolation structures 6, n-type wells ("N-well"), and/or p-type wells ("P-well," not shown). The area of the semiconductor substrate comprising a semiconductor material such as silicon or a silicon germanium alloy and surrounded by the shallow trench isolation structures 6 is referred to an RX area, in which source and drain regions of transistors may be formed by methods known in the art. Each of the gate electrode structures 20 comprises a gate dielectric, a gate conductor line, and a gate spacer surrounding the gate conductor, and may be formed by methods known in the art. A mobile ion diffusion barrier layer 12, comprising a dielectric material that is impervious to mobile ions such as silicon nitride, is formed over the semiconductor substrate 10 and the gate electrode structures 20. The mobile ion diffusion barrier layer 12 prevents diffusion of mobile ions from back-end-of-the-line (BEOL) structures into the semiconductor substrate 10 or the gate level structures 20.

The back-end-of the-line (BEOL) structures include the semiconductor structure located above the mobile ion diffusion barrier layer 12. The BEOL structures include a stack, from bottom to top, of the CA-M1 level dielectric layer 30, an M1 level dielectric cap layer 32, the second metal line (M2) level dielectric layer 40, an M2 level dielectric cap layer 42, the second via (V2) level dielectric layer 50, the third metal line (M3) level dielectric layer 60, the M3 level dielectric cap layer 62, and the dielectric passivation layer 70. The various dielectric layers and passivation layers may be formed by chemical vapor deposition or a spin-on coating.

Specifically, the CA-M1 level dielectric layer 30 is formed by chemical vapor deposition or by a spin-on coating. The CA-M1 level dielectric layer 30 may be formed as a single dielectric layer, or may be formed as multiple dielectric layers. The CA-M1 level dielectric layer 30 typically comprises silicon oxide, which has a refractive index of about 1.45. CA level contact vias 36 are formed in a lower portion of the CA-M1 level dielectric layer 30 to provide an electrical connection to a semiconductor device in the semiconductor substrate 10 to an M1 line 38, which is formed in an upper portion of the CA-M1 level dielectric layer 30. Typically, the CA level contact vias 36 comprises W, and the M1 line 38 comprises Cu. The M1 level dielectric cap layer 32 is formed on a top surface of the CA-M1 level dielectric layer 30. The M1 level dielectric cap layer 32 typically comprises a material resistant to chemical mechanical polish so that it is effective as a stopping layer during a planarization process. Typical materials for the M1 level dielectric cap layer include silicon nitride and a barrier low-k dielectric material such as BLoK™ by Applied Materials Inc. that is suitable as a barrier/etch stop film for copper damascene applications. The M1 level dielectric cap layer 32 may be subsequently patterned so that the M1 level dielectric cap layer 32 is removed within the optical path of the pixels in the pixel area.

The M2 level dielectric layer 40 is formed over the M1 level dielectric cap layer 32 by methods known in the art. The M2 level dielectric layer 40 typically comprises silicon oxide. V1 vias 46 are formed in a lower portion of the M2 level dielectric layer 40 to provide an electrical connection between an underlying M1 line 38 and an M2 line 48, which is formed in an upper portion of the M2 level dielectric layer 40. Typically, the V1 vias 36 and the M2 lines 48 comprise Cu. The M2 level dielectric cap layer 42 is formed on a top surface of the M2 level dielectric layer 40. The M2 level dielectric cap layer 42 typically comprises a material resistant to chemical mechanical polish as the M1 level dielectric cap layer 32. The M2 level dielectric cap layer 42 may be subsequently patterned so that the M2 level dielectric cap layer 42 is removed within the optical path of the pixels in the pixel area. As many additional metal wiring levels including conductive vias and metal lines may be formed over the M2 level dielectric cap layer 42 as needed.

On top of a last wiring level containing conventional metal wiring structures, a last via level dielectric layer is deposited, in which last level conductive vias are formed. In the exemplary semiconductor structure of FIG. 1, the V2 level dielectric layer 50 is formed over the M2 level dielectric cap layer 42. Typically, the V2 level dielectric layer 50 comprises silicon oxide which has a refractive index of about 1.45. A second via level (V2) via 54 is formed by lithographic methods, an anisotropic etch, a metal fill, and planarization. The V2 via 54 comprises metal such as W.

The exemplary semiconductor structure comprises flat-top convex-bottom lower lenses 280 comprising a dielectric material having a refractive index higher than the refractive index of the material of the V2 level dielectric layer 50. The exemplary semiconductor further comprises at least one aluminum structure such as an aluminum light shield 66 over the dark pixel area, an aluminum bond pad 67, and aluminum metal lines 68. Optionally, at least one metallic barrier structure 52 may be formed between the V2 level dielectric layer 50 and the at least one aluminum structure (66, 67, 68). If the at least one metallic barrier structure 52 is present, the sidewalls of the at least one metallic barrier structure 52 and the sidewalls of the at least one aluminum structure (66, 67, 68) are substantially vertically coincident since the same lithographic mask is employed to pattern the at least one metallic barrier structure 52 and the at least one aluminum structure (66, 67, 68).

The M3 level dielectric layer 60 and the M3 level dielectric cap layer 62 are formed over the various aluminum structures (66, 67, 68) and the V2 level dielectric layer 50 to provide passivation, or protection of the underlying structures from the ambient and ingress of moisture or contamination materials. A portion of the aluminum bonding pad, if present, is exposed to enable boding of external wires or C4 bonding. Filter materials are deposited and patterned in the pixel area to provide filtering of lights for each pixel. Multiple types of filter materials may be employed, or alternatively, one type of filter material may be deposited and patterned to have different thicknesses for each pixel type. A passivation layer 70 is formed, followed by formation of the convex-top flat-bottom lenses 80 as known in the art.

Figure 2:
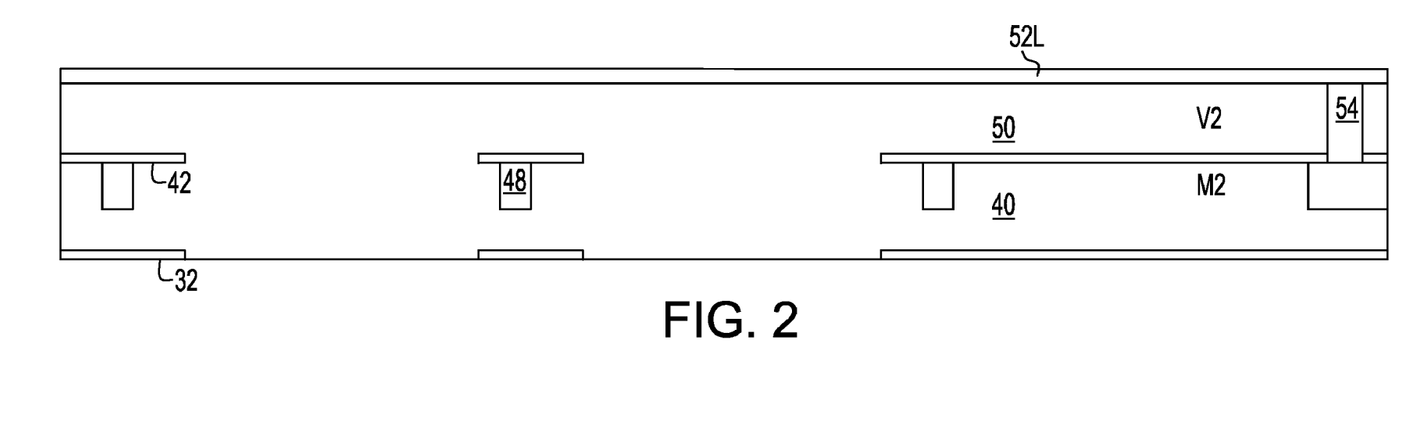
FIGS. 2-8 are magnified sequential vertical cross-sectional views of a pixel area of the exemplary semiconductor structure above a first metal line (M1) level according to the present invention.

FIGS. 2-8 describe an exemplary manufacturing sequence employed to form the exemplary semiconductor structure shown in FIG. 1. Referring to FIG. 2, the portion of the exemplary semiconductor structure above the first metal line (M1) level during a process step of a manufacturing process is shown for the pixel region. After formation of the V2 level dielectric layer 50 and the V2 via 54, an optional metallic barrier layer 52L is formed, for example, by chemical vapor deposition (CVD), atomic layer deposition (ALD), or physical vapor deposition (PVD). The optional metallic barrier layer 52L is optional, i.e., may, or may not, be formed in the exemplary semiconductor structure. While the present invention is described for the case in which the optional metallic barrier layer 52L is present, variations of the present invention in which an optional metallic barrier layer is omitted is also explicitly contemplated herein.

The optional metallic barrier layer 52L comprises a metal or a metallic alloy. Preferably, the optional metallic barrier layer 52L comprises a conductive metal nitride material such as TiN, TaN, WN, AlN, or a combination thereof. The optional metallic barrier layer 52L may have a thickness from about 5 nm to about 100 nm, and typically from about 20 nm to about 50 nm, although lesser and greater thicknesses are also contemplated herein.

Figure 3:
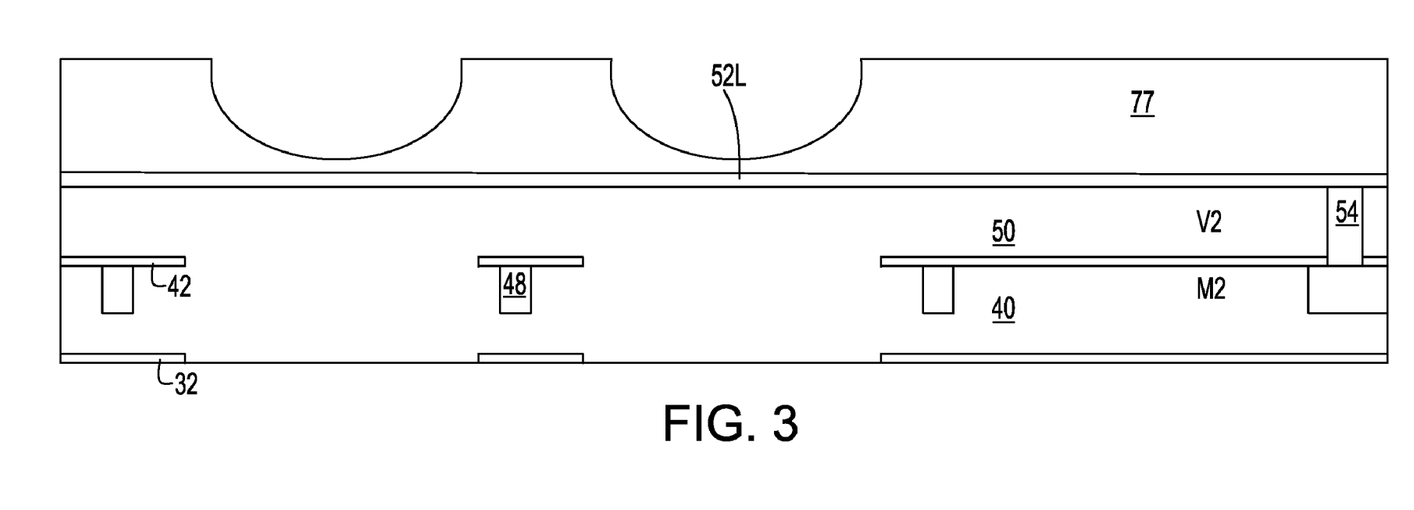

Referring to FIG. 3, a positive tone photoresist 77 is applied over the V2 level dielectric layer 50. The positive tone photoresist 77 is applied directly on the optional metallic barrier layer 52L, if present, or directly on the V2 level dielectric layer 50 is a metallic barrier layer is not present. The positive tone photoresist 77 reacts to exposure such that an illuminated area is removed during development, hence the name "positive tone" photoresist. The thickness of the positive tone photoresist 77 may be from about 250 nm to about 1,200 nm, and typically from about 500 nm to about 900 nm, although lesser and greater thicknesses are also contemplated herein.

In one embodiment of the present invention, the positive tone photoresist 77 is exposed under a defocused illumination condition so that no sharp boundary between an exposed area and an unexposed area is present in the positive tone photoresist 77, i.e., the amount of photons impinging on the positive tone photoresist 77 varies continuously so that the degree of exposure varies gradually in the lateral direction. Development of the positive tone photoresist 77 after exposure results in concave cavities, each of which having a continuous and concave profile in the positive tone photoresist 77. In other words, the center of each concave cavity is the deepest point within the concave cavity, the depth of the cavity strictly decreases with an increase in lateral distance from the center, and the rate of decrease in the depth, which is the second derivative of depth with respect to the radial distance from the center of the concave cavity, increases with the increase in the lateral distance from the center.

Figure 4:
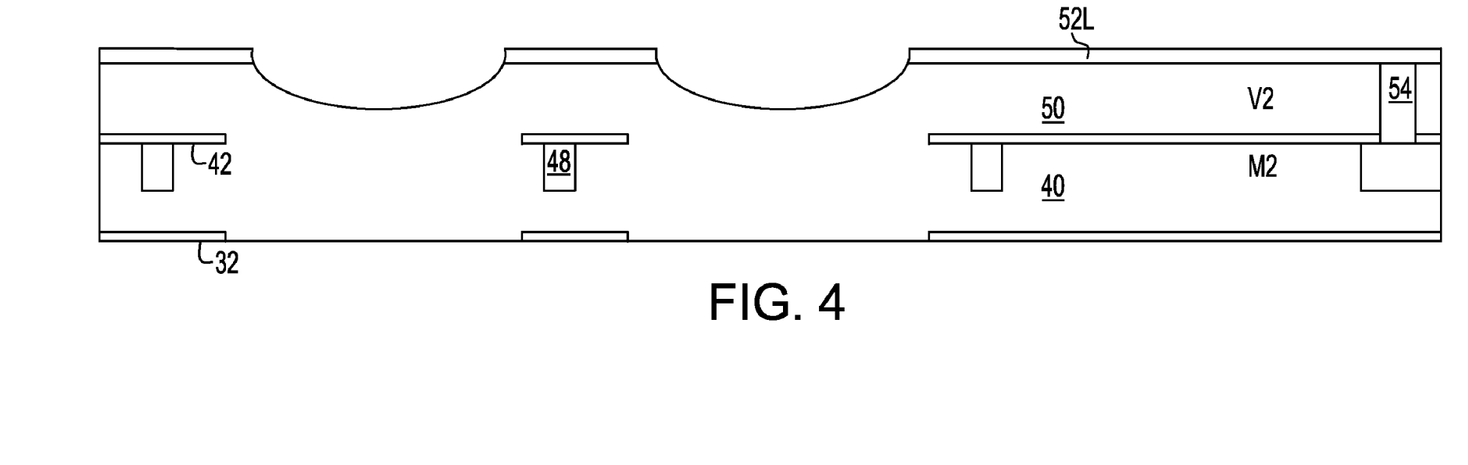

Referring to FIG. 4, the profile of the concave cavities in the positive tone photoresist 77 is transferred into the V2 level dielectric layer 50 to form replicated concave cavities in the V2 level dielectric layer 50. Preferably, a non-selective reactive ion etch is employed for the transfer of the profile in the positive tone photoresist 77 into the replicated profile formed in the V2 level dielectric layer 50, which is typically a silicon oxide layer. The non-selective etch has etch rates of the same order of magnitude across the positive tone photoresist 77 and the V2 level dielectric layer 50, i.e., the etch rate of the positive tone photoresist 77 and the etch rate of the V2 level dielectric layer 50 are of the same order of magnitude during the non-selective etch. Preferably, the etch rate of the positive tone photoresist 77 and the etch rate of the V2 level dielectric layer 50 are substantially the same during the non-selective etch, which may be an isotropic etch or an anisotropic etch. Also, the etch rate of the optional metallic barrier layer 52L is of the same order of magnitude as the etch rate of the V2 level dielectric layer 50. Typically, the depth of the bottom of each concave cavity in the V2 level dielectric layer 50, as measured from a top surface of the optional metallic barrier layer 52L, may be from about 100 nm to about 1,000 nm, and typically from about 200 nm to about 500 nm, although lesser and greater thicknesses are also contemplated herein.

Figure 5:
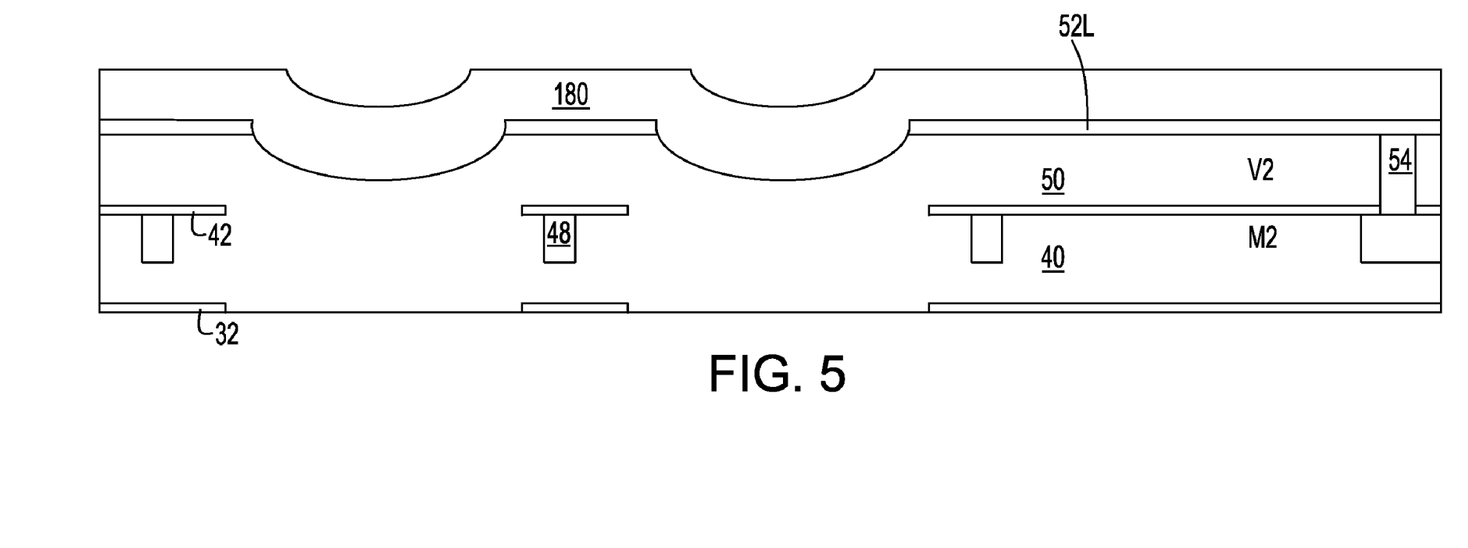

Referring to FIG. 5, the concave cavities in the V2 level dielectric layer 50 is filled with a dielectric material having a different refractive index than the refractive index of the V2 level dielectric layer 50. The dielectric material may be deposited by chemical vapor deposition (CVD), physical vapor deposition (PVD, or sputtering), or atomic layer deposition (ALD). The dielectric material formed a dielectric material layer 180 that fills the concave cavities completely, i.e., the lowest point of the top surface of the dielectric material layer 180 is located above the top surface of the optional metallic barrier layer 52L. Preferably, the dielectric material that may be employed to fill the concave trenches has a dielectric constant greater than the dielectric constant of silicon oxide, which is about 1.45, and may comprise silicon nitride (refractive index: 2.02), aluminum oxide (refractive index: 1.79), aluminum nitride (refractive index: 2.11), gallium nitride (refractive index: 1.97), gallium phosphide (refractive index: 3.31), hafnium oxide (refractive index: 1.9), indium nitride (refractive index: 2.9), indium tin oxide (refractive index: 1.8), tantalum pentoxide (refractive index: 2.1), titanium dioxide (refractive index: 2.88), zinc sulfide (refractive index: 2.354), other dielectric material having a dielectric constant greater than 1.45, or a combination thereof.

Figure 6:
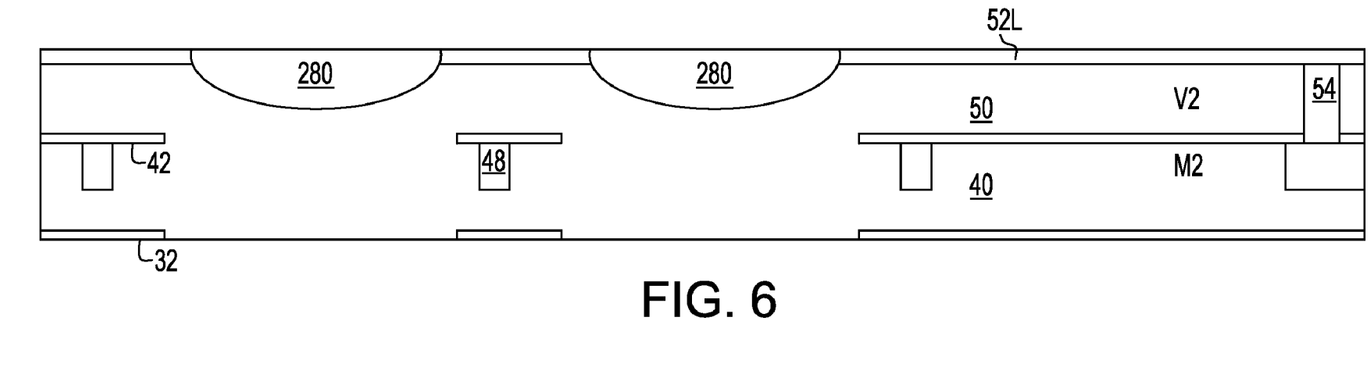

Referring to FIG. 6, the dielectric material layer 180 is planarized, for example, by a chemical mechanical planarization (CMP) process. If the optional metallic barrier layer 52L may be employed as a stopping layer for the CMP process, if present. If no metallic barrier layer is present in the semiconductor structure, the V2 level dielectric layer 50 may be employed as a stopping layer. The remaining portions of the dielectric material layer 180 constitute flat-top convex-bottom lower lenses 280. Each of the flat-top convex-bottom lower lenses 280 has a flat top surface formed by the CMP process and substantially coplanar with top surfaces of the optional metallic barrier layer 52L. Also, each of the flat-top convex-bottom lower lenses 280 have a convex bottom surface since bottom surface of each flat-top convex-bottom lower lens 280 protrudes out the most at the center of the bottom surface and has a curvature that increases with a radial distance from the center of each flat-top convex-bottom lower lens 280. In other words, the radius of curvature for the bottom surface of a flat-top convex-bottom lower lens 280 decreases with the radial distance from the center of the flat-top convex-bottom lower lens 280. Thus, each concave cavity in the V2 level dielectric layer 50 is completely filled with one of the flat-top convex-bottom lower lenses 280.

Figure 7:
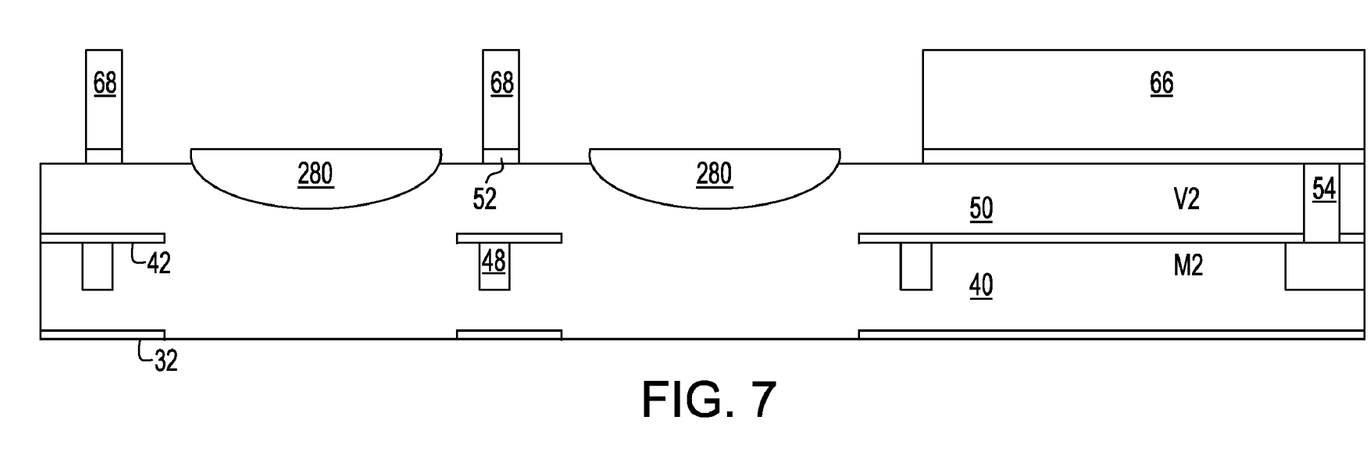

Referring to FIG. 7, an opaque aluminum layer (not shown) is deposited, for example, by physical vapor deposition (PVD), i.e., sputtering. The thickness of the opaque aluminum layer may be from about 1 μm to about 10 μm, and typically from about 1.5 μm to about 5 μm, although lesser and greater thicknesses are also contemplated herein. Substitution of the opaque aluminum layer with an equivalent metal layer is also contemplated herein. The opaque aluminum layer is lithographically patterned by applying a photoresist (not shown), exposing and developing the photoresist to form a pattern, and transferring the pattern by an anisotropic etch into the opaque aluminum layer to form at least one aluminum structure. Such aluminum structures may include an aluminum light shield 66, which is typically formed over a dark pixel area, an aluminum bond pad (refer to element 67 in FIG. 1), and aluminum metal lines 68. The anisotropic etch is preferably selective to the flat-top convex-bottom lower lenses 280. If the optional metallic barrier layer 52L is present in the semiconductor structure, the anisotropic etch transfers the pattern in the photoresist into the optional metallic barrier layer 52L to form at least one metallic barrier structure 52 that underlies the at least one aluminum structure (66, 67, 68). The horizontal cross-sectional area of the at least one metallic barrier structure 52 and the horizontal cross-sectional areas of the at least one aluminum structure (66, 67, 68) is congruous since the same patterned photoresist is employed to pattern them. As a consequence, sidewalls of the at least one metallic barrier structure 52 and the sidewalls of the at least one aluminum structure (66, 67, 68) substantially coincide vertically. The at least one metallic barrier structure 52 and the sidewalls of the at least one aluminum structure (66, 67, 68) are formed outside the area of active pixels to insure that optical paths to the flat-top convex-bottom lower lenses 280 for the active pixels are not blocked. Thus, the at least one metallic barrier structure 52 and the sidewalls of the at least one aluminum structure (66, 67, 68) are disjoined from the flat-top convex-bottom lower lenses 280 for the active pixels.

Figure 8:
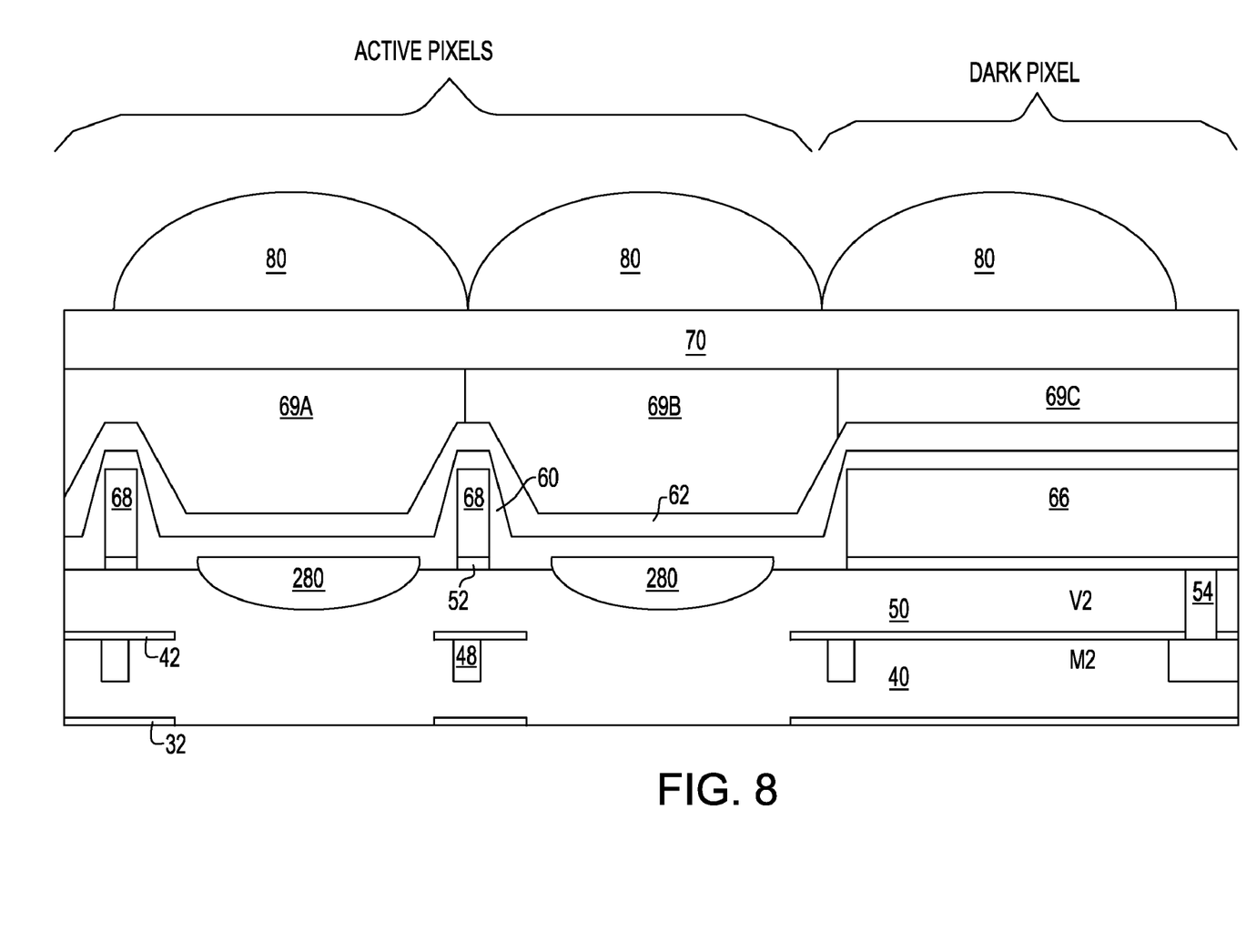

Referring to FIG. 8, the third metal line (M3) level dielectric layer 60, which typically comprises silicon oxide, is formed by chemical vapor deposition (CVD) or by a spin-on coating over the at least one aluminum structure (66, 67, 68), the flat-top convex-bottom lower lenses 280, and the V2 level dielectric layer 50. The boundary between the V2 level dielectric layer 50 and the third metal line (M3) level dielectric layer 60 are marked by a broken line. The M3 level dielectric cap layer 62, which comprises an impermeable dielectric material such as silicon nitride, is formed over the M3 level dielectric layer 60. The M3 level dielectric cap layer 62 prevents ingress of moisture and/or oxygen into the underlying metal interconnect structures.

Color filter materials are thereafter deposited over the M3 level dielectric layer 60 and lithographically patterned to form various color filters such as a first color filter 69A, a second color filter 69B, and an optional dark pixel color filter 69C. As many active pixels are formed in the active pixel area as the variety of color filters to be employed in the CMOS image sensor unit cell. For example, the active pixel area may contain three active pixels corresponding to a red color, a green color, and a blue color. The first color filter 69A may transmit a first of the three colors, the second filter 69B may transmit a second of the three colors, and another color filter (not shown) within another pixel (not shown) may transmit the last of the three colors. The optional dark pixel color filter 69C is optional, i.e., may, or may not, be present. The various color filters (69A, 69B, 69C) may have a thickness from about 300 nm to about 3,000 nm.

The dielectric passivation layer 70 is formed over the various color filters (69A, 6B, 69C) to provide protection from the ambient by preventing ingress of moisture or other contaminants. The dielectric passivation layer 70 preferably comprises a material that may be applied at a relatively low temperature, e.g., below 300° C. For example, the dielectric passivation layer 70 may comprise acrylate, methacrylate, epoxy-acrylate, polyimide, or a combination thereof, and has a dielectric constant from about 1.2 to about 1.7. The thickness of the dielectric passivation layer 70 may be from about 300 nm to about 3,000 nm.

The convex-top flat-bottom upper lenses 80 are formed over the dielectric passivation layer 70 by methods known in the art. Each of the convex-top flat-bottom lenses 80 has a convex top surface and a flat bottom surface. Typically, the convex-top flat-bottom upper lenses 80 comprise a dielectric material such as acrylate, methacrylate, epoxy-acrylate, polyimide, or a combination thereof. The thickness of the convex-top flat-bottom upper lenses 80, as measured at the center of each convex-top flat-bottom upper lenses 80, may be from about 300 nm to about 3,000 nm. To enhance quantum efficiency, i.e., the amount of charge generation, of the pixels, the convex-top flat-bottom upper lenses 80 are formed optically aligned to the flat-top convex-bottom lower lenses 280.

The composite lens system in each active pixel comprises a convex-top flat-bottom upper lens 80 and a flat-top convex-bottom lower lens 280 that is optically aligned to focus photons incident on any top surface of the convex-top flat-bottom upper lens 80 onto the photodiode 8 located underneath. Unlike prior art structures, the flat-top convex-bottom lower lens 280 is free of any step so that there is no optical singularity, enhancing the effectiveness of the overall composite lens system and delivering more light onto the photodiode 8. The dimensions and the material, and correspondingly the refractive index thereof, of the flat-top convex-bottom lower lens 280 may be optimized to deliver optimal focusing of the photons incident on the upper surface of the convex-top flat-bottom upper lens 80.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
    forming a silicon oxide layer on top of a metal interconnect structure;
    forming at least one metal structure having a top surface that is coplanar with a topmost surface of said silicon oxide layer within said silicon oxide layer;
    applying a positive tone photoresist on said silicon oxide layer;
    exposing said positive tone photoresist under a defocused illumination condition;
    developing said positive tone photoresist, wherein said positive tone resist has a continuous and concave profile in an exposed area after development;
    transferring said profile into said silicon oxide layer to form a concave cavity in said silicon oxide layer; and
    forming a flat-top convex-bottom lens comprising a dielectric material in said concave cavity, wherein a bottommost surface of said flat-top convex-bottom lens is located below a level of said topmost surface of said silicon oxide layer.

2. The method of claim 1, further comprising forming a metallic barrier layer directly on said silicon oxide layer, wherein said positive tone resist is applied directly on said metallic barrier layer.

3. The method of claim 2, wherein said metallic barrier layer comprises TiN, TaN, WN, AlN, or a combination thereof.

4. The method of claim 1, wherein a thickness of said positive tone photoresist varies continuously throughout an entirety of said positive tone photoresist after said developing.

5. The method of claim 1, wherein said dielectric material comprises silicon nitride.

6. The method of claim 1, further comprising planarizing said dielectric material to form a flat surface, wherein said flat surface is a top surface of said flat-top convex-bottom lens.

7. The method of claim 6, further comprising forming a metallic barrier layer directly on said silicon oxide layer, wherein said metallic barrier layer is a stopping layer during said planarizing of said dielectric material.

8. The method of claim 1, further comprising:
forming an aluminum layer on said silicon oxide layer and said flat-top convex-bottom lens; and
patterning said aluminum layer to form an aluminum metal line, a light shield, or an aluminum bond pad.

9. The method of claim 8, further comprising:
forming a color filter above said flat-top convex-bottom lens; and
forming a convex-top flat-bottom lens over said color filter.

10. The method of claim 8, further comprising forming a conductive via in said silicon oxide layer, wherein said conductive via is electrically connected to said aluminum bond pad.

11. The method of claim 1, further comprising employing a non-selective reactive ion etch is employed for said transferring of said profile into said silicon oxide layer, wherein said non-selective reactive ion etch removes said silicon oxide layer and said positive tone resist at substantially the same rate.

12. A method of forming a semiconductor structure comprising:
forming a silicon oxide layer on top of a metal interconnect structure;
forming at least one metal structure having a top surface that is coplanar with a topmost surface of said silicon oxide layer within said silicon oxide layer;
applying a positive tone photoresist on said silicon oxide layer;
exposing said positive tone photoresist employing a half-tone mask, wherein said half-tone mask induces gradual variation of dose of exposure light across said positive tone photoresist;
developing said positive tone photoresist, wherein said positive tone resist has a continuous and concave profile in an exposed area after development;
transferring said profile into said silicon oxide layer to form a concave cavity in said silicon oxide layer; and
forming a flat-top convex-bottom lens comprising a dielectric material in said concave cavity, wherein a bottommost surface of said flat-top convex-bottom lens is located below a level of said topmost surface of said silicon oxide layer.

13. The method of claim 12, further comprising forming a metallic barrier layer directly on said silicon oxide layer, wherein said positive tone resist is applied directly on said metallic barrier layer.

14. The method of claim 12, wherein said dielectric material comprises silicon nitride.

15. The method of claim 12, further comprising:
forming an aluminum layer on said silicon oxide layer and said flat-top convex-bottom lens; and
patterning said aluminum layer to form an aluminum metal line, a light shield, or an aluminum bond pad;
forming a color filter above said flat-top convex-bottom lens; and
forming a convex-top flat-bottom lens over said color filter.

* * * * *